United States Patent [19]

Dhar

[11] Patent Number: 5,703,798

[45] Date of Patent: Dec. 30, 1997

[54] SWITCH LEVEL SIMULATION EMPLOYING DYNAMIC SHORT-CIRCUIT RATIO

[75] Inventor: Sanjay Dhar, Lake Oswego, Oreg.

[73] Assignee: Mentor Graphics Corporation, Wilsonville, Oreg.

[21] Appl. No.: 428,725

[22] Filed: Apr. 25, 1995

[51] Int. Cl.$^6$ .................................................. G06F 9/455
[52] U.S. Cl. ............................................................ 364/578
[58] Field of Search ...................................... 364/578, 488, 364/489, 490, 491

[56] References Cited

U.S. PATENT DOCUMENTS

| | | | |
|---|---|---|---|
| 4,815,024 | 3/1989 | Lewis | 364/802 |
| 4,817,012 | 3/1989 | Cali' | 364/488 |
| 4,827,428 | 5/1989 | Dunlop et al. | 364/491 |
| 4,835,726 | 5/1989 | Lewis | 364/802 |
| 4,907,180 | 3/1990 | Smith | 364/578 |
| 4,967,367 | 10/1990 | Piednoir | 364/489 |
| 5,051,911 | 9/1991 | Kimura et al. | 364/468 |
| 5,095,454 | 3/1992 | Huang | 364/578 |
| 5,163,016 | 11/1992 | Har'El et al. | 364/578 |
| 5,202,841 | 4/1993 | Tani | 364/491 |
| 5,278,769 | 1/1994 | Bair et al. | 364/490 |
| 5,305,229 | 4/1994 | Dhar | 364/489 |
| 5,446,676 | 8/1995 | Huang et al. | 364/578 |
| 5,477,460 | 12/1995 | Vakirtzis et al. | 364/489 |
| 5,515,291 | 5/1996 | Omori et al. | 364/488 |
| 5,553,008 | 9/1996 | Huang et al. | 364/578 |
| 5,572,437 | 11/1996 | Rostoker et al. | 364/489 |

OTHER PUBLICATIONS

"Short–Circuit Dissipation of Static CMOS Circuitry and Its Impact on the Design of Buffer Circuits," Harry J.M. Veendrick, *IEEE Journal of Solid–State Circuits*, vol. SC–19, No. 4, Aug. 1984, pp. 468–473.

"Hercules: A Power Analyzer for MOS VLSI Circuits," Akhilesh Tyagi, 1987 IEEE, pp. 530–533.

"Inverter Models of CMOS Gates for Supply Current and Delay Evaluation," A. Nabavi–Lishi, et al. *IEEE Transactions on Computer–Aided Design of Integrated Circuits and Systems*, vol. 13, No. 10, Oct. 1994, pp. 1271–1279.

"Input Waveform Slope Effects in CMOS Delays," *IEEE Journal of Solid–State Circuits*, vol. 25, No. 6, Dec. 1990, pp. 1588–1590.

"Timing Simulation for Large Digital MOS Circuits," *Advances in Computer–Aided Engineering Design*, 1986, vol. 1, pp. 1–92.

"Delay Modeling and Timing of Bipolar Digital Circuits," D. G. Saab, et al., 25th ACM/IEEE Design Automation Conference, Paper 21.2, pp. 288–293.

"Computing Signal Delay in General RC Networks by Tree/Link Partitioning," Pak K. Chan, et al., 26th ACM/IEEE Design Automation Conference, Paper 31.1, pp. 485–490.

(List continued on next page.)

*Primary Examiner*—Kevin J. Teska
*Assistant Examiner*—Matthew Loppnow
*Attorney, Agent, or Firm*—Klarquist Sparkman Campbell Leigh & Whinston, LLP

[57] ABSTRACT

A switch level simulator having switch level speeds with near the accuracy of a circuit level simulator. Circuit parameters such as peak current, delay, and charge are calculated by using a dynamic short-circuit ratio. In the preferred embodiment a computer having a processor and memory is used to run the circuit simulations. A lookup table is built which represents how the circuit parameters vary with a change in the dynamic short-circuit ratio. The dynamic short-circuit ratio is calculated by taking the ratio of a first resistance in a first circuit path switching OFF to a second resistance in a second circuit path switching on. The circuit paths might be a parallel or series set of transistors which need to be combined to form an effective resistance for each path. The calculated dynamic short-circuit ratio is then used in the lookup table to determine the parameters in question.

24 Claims, 3 Drawing Sheets

OTHER PUBLICATIONS

"A Recursive Technique for Computing Delays in Series–Parallel MOS Transistor Circuits," Jean–Paul Caisso, et al., *IEEE Transactions on Computer–Aided Design*, vol. 10, No. 5, May 1991, pp. 589–595.

"Signal Delay in RC Tree Networks," Jorge Rubinstein, et al., *IEEE Transactions on Computer–Aided Design*, vol. CAD–2, Jul. 1983, pp. 202–211.

"The Transient Response of Damped Linear Networks with Particular Regard to Wideband Amplifiers," W. C. Elmore, *Journal of Applied Physics*, vol. 19, Jan., 1948, pp. 55–63.

"Signal Delay in General RC Networks," Tzu–Mu Lin, et al., *IEEE Transactions on Computer–Aided Design*, vol. CAD–3, No. 4, Oct. 1984, pp. 331–349.

"Depth–First Search and Linear Graph Algorithms," Robert Tarjan, *SIAM J. Comput.*, vol. 1, No. 2, Jun. 1972, pp. 146–160.

"A Switch–Level Model and Simulator for MOS Digital Systems," Randal E. Bryant, *IEEE Transactions on Computers*, vol. C–33, No. 2, Feb. 1984, pp. 160–177.

"Automatic Modeling of Switch–Level Networks Using Partial Orders," Prathima Agrawal, et al., *IEEE Transactions on Computer–Aided Design*, vol. 9, No. 7, Jul. 1990, pp. 696–707.

"Magnitude Classes in Switch–Level Modeling," E. Cerny, et al., IEEE 1988, pp. 284–288.

"Switch–Level Simulation Using Dynamic Graph Algorithms," Dan Adler, IEEE 1991, pp. 346–355.

"Leadout: A Static Timing Analyzer for MOS Circuits," G. Szymanski, IEEE International Conference on Computer–Aided Design, 1986, Santa Clara, CA, pp. 130–133.

*Principles of CMOS VLSI Design*, N. Weste, et al., 1985, Addison–Wesley, Reading, Mass., pp. 317–319.

*Introduction to Electric Circuits*, H.W. Jackson, 1981, Prentice–Hall, Inglewood Cliffs, NJ, pp. 448–450.

"Dividing a Graph Into Triconnected Components," J.E. Hopcroft, et al., *SIAM Journal on Computing*, Sep. 1973, vol. 2, No. 3, pp. 135–158.

*Data Structures and Network Algorithms*, R.E. Tarjan, Society for Industrial and Applied Mathematics, 1983, Philadelphia, PA, pp. 85–96.

"A Switch–Level Timing Verifier for Digital MOS VLSI," J. K. Ousterhout, IEEE Transactions on CAD, Jul. 1985.

"Delay Prediction from Resistance–Capacitance Models of General MOS Circuits," D. Martin, et al., IEEE Transactions on CAD, Jul. 1993, vol. 12, No. 7.

Tjarnstrom, Power Dissipation Estimate by Switch Level Simulation, IEEE, pp. 881–884, May 1989.

Rouatbi et al, Power Estimation Tool for Sub–Micron CMOS VLSI Circuits, IEEE, pp. 204–209, Nov. 1992.

Ruan et al, Logic Simulation with Current–Limited Switches, IEEE, pp. 133–141, Feb. 1990.

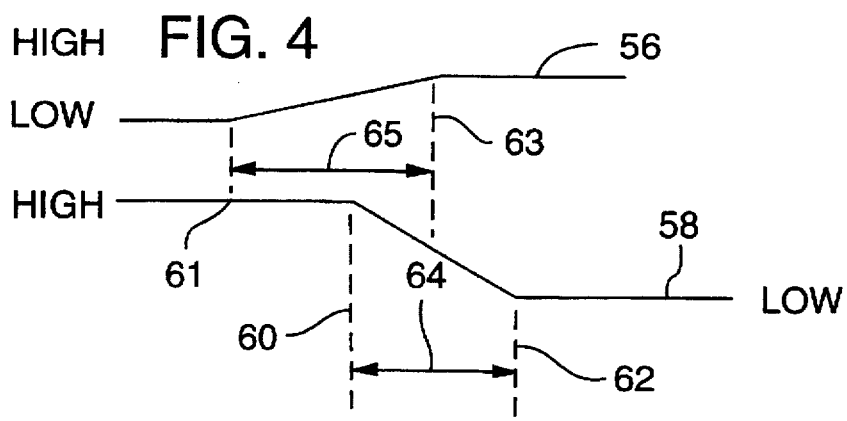
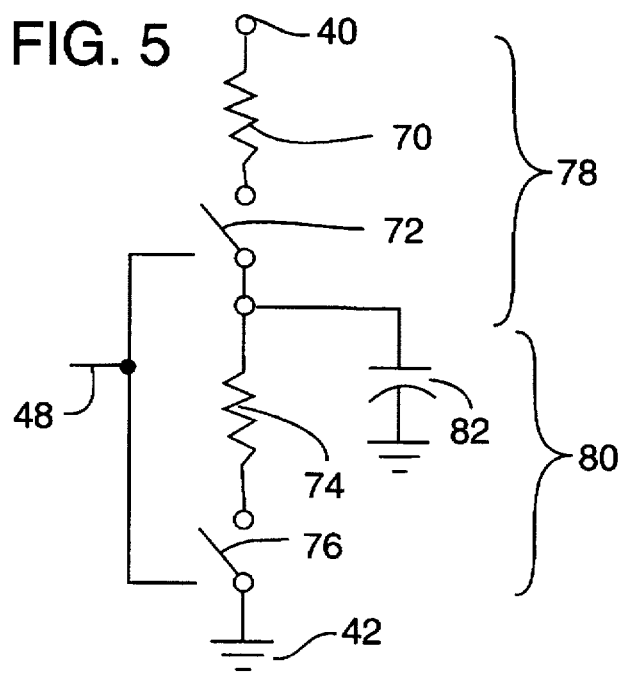
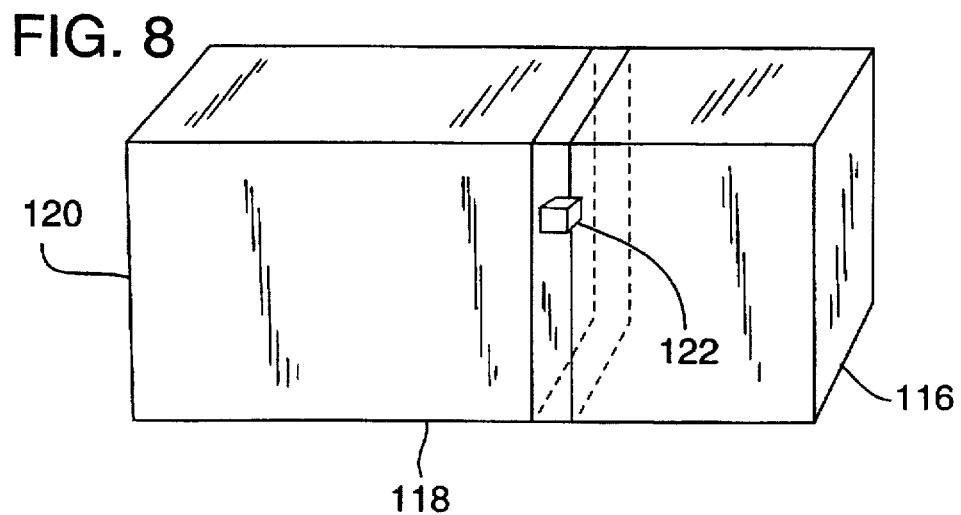

SWITCH LEVEL SIMULATION EMPLOYING DYNAMIC SHORT-CIRCUIT RATIO

FIELD OF THE INVENTION

The present invention relates to the simulation of electronic circuits, and finds particular application in the simulation of such circuits at a switch level abstraction.

BACKGROUND AND SUMMARY OF THE INVENTION

Current fabrication technologies with line widths of less than 0.5 μm result in chips with greater than 2 million transistors. Such complex electronic circuits are typically simulated before being fabricated in silicon. Simulation allows the operational characteristics of the circuits to be tested and analyzed in a favorable environment, thus preventing costly errors in fabricated circuits.

One class of simulators (e.g., SPICE) uses a circuit level abstraction. Such circuit level simulators model the circuit's transistors using complex non-linear equations. These simulators are time driven so that at each time step (typically a pico or nano second) the state of the circuit is updated through differential equation analysis.

While circuit level simulators are extremely accurate, the complicated analysis undertaken at pico or nano second intervals requires extended periods of time, rendering the simulators impractical for simulating circuits larger than a few thousand transistors.

To address the speed problems of circuit level simulators, switch level simulators were developed capable of running circuit simulations thousands of times faster. In switch level simulation a transistor is modeled as a switch having a binary ON and OFF state. When turned ON, the switch is a series resistor with some associated capacitance. When OFF, the switch is an infinite resistance. As a result, switch level simulation reduces a complex network of transistors into a RC network, allowing for a simpler computational analysis using an RC network-based algorithm instead of differential equations.

A problem with switch level simulators is that they sacrifice accuracy for speed. Switch level simulators only incorporate into their analysis transistors making a transition to the ON or active state; the transistors which are being deactivated or turned OFF are ignored. In practice, however, transistors which are being deactivated play a major role in determination of the circuit's behavior.

One parameter which is affected by transistors making the transition to the OFF state is the dynamic short-circuit current. The dynamic short-circuit current is a transient current between power and ground that occurs when transistor combinations switch, and is typically 20%, but can be as large as 50%, of the total current in the circuit.

Other parameters of importance in determining power consumption and noise effects of integrated circuits are the propagation delay and charge.

Prior art switch simulation methods have led to inaccuracies on the order of 100% in the actual dynamic short-circuit current, and consequent errors in parameters such as propagation delay and charge.

In accordance with a preferred embodiment of the present invention, the foregoing and other drawbacks of the prior art are overcome. One embodiment of the present invention uses a simulator having switch level speeds but accuracy near that of a circuit level simulator. In the preferred embodiment a lookup table is built which represents how parameters such as current, charge, and delay vary with dynamic short-circuit ratio. The dynamic short-circuit ratio is calculated by taking the ratio of a first resistance in a first circuit path switching OFF to a second resistance in a second circuit path switching ON. The circuit paths might be a parallel or series set of transistors which need to be combined to form an effective resistance for each path. The calculated dynamic short-circuit ratio is then used in the lookup table to determine the parameters in question.

The foregoing and additional features and advantages of the present invention will be more readily apparent from the following detailed description, which proceeds with reference to the accompanying drawings.

BRIEF DESCRIPTION OP THE DRAWINGS

FIG. 4 is an illustrative diagram of input and output waveforms used in conjunction with the inverter of FIG. 3.

FIG. 5 is a diagram showing switch level modeling of the inverter of FIG. 3 as a pair of switches, a pair of resistors, and a load capacitor.

FIG. 8 is diagram representing a three-dimensional table used in one embodiment of the present invention.

DETAILED DESCRIPTION OF THE PREFERRED EMBODIMENT

Figure 1:
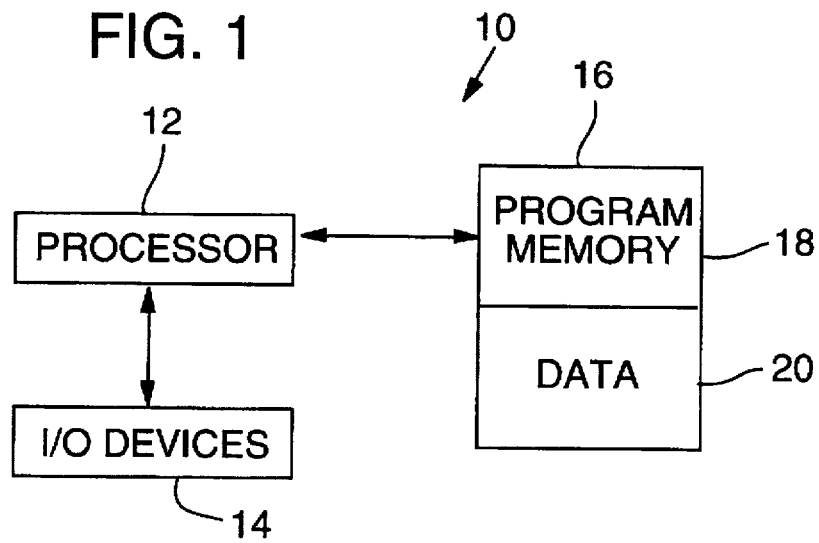
FIG. 1 is a diagram showing a computer system used to execute simulation methods according to one embodiment of the present invention.

Referring to FIG. 1, an illustrative embodiment of the present invention includes a computer aided design system 10 having an internal processor 12, I/O devices 14, and a memory 16 for storing programs 18 and data 20.

The processor 12 is a RISC microprocessor run on a Sun or Hewlett-Packard workstation, but any processor with sufficient power to execute the methods described herein can be utilized. The processor 12 is capable of compiling simulated circuit information into a usable format and is capable of running a switch-level simulator which models a circuit's operation and timing.

The I/O devices 14 generally include such peripheral devices as a monitor, a keyboard, and a printer. The monitor typically displays information related to the simulation while the printer allows printouts of signals produced at selected nodes during the simulation. The keyboard or mouse allows the user to input information necessary to run the simulation.

Memory 16 is segmented into the program section 18 and the data section 20. The program section 18 stores the simulator programs. Data section 20 stores both event data (which indicates whether nodes will change state) and circuit data (which represents the circuits to be simulated). Additionally, data section 20 stores lookup tables which may contain data related to delay, charge and current for any given capacitive load, input slew, and short-circuit ratio.

Figure 2:
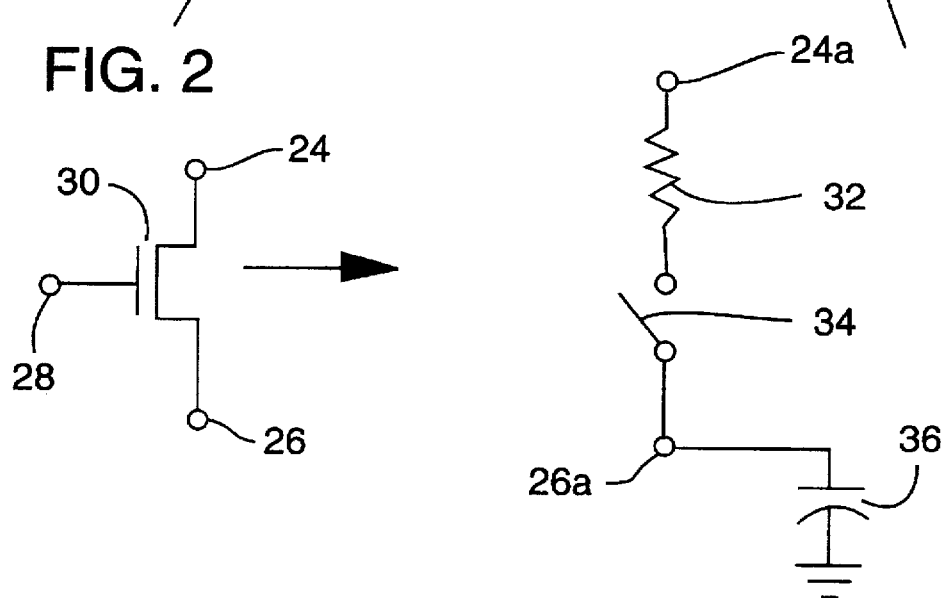
FIG. 2 is a diagram showing switch level modeling of a transistor as a switch, a resistor, and a load capacitor.

FIG. 2 shows switch-level modeling of an n-type transistor 30. The transistor 30 includes nodes 24, 26 and gate 28.

When gate 28 goes from low to high, transistor 30 allows current to flow from node 24 to node 26. As can be seen, transistor 30 is modeled as a resistor 32, a switch 34, and a load capacitance 36 (assuming node 26 is an output node). When gate 28 goes low to high, switch 34 closes allowing current to flow from node 24a to node 26a. When the gate goes high to low, switch 34 remains open so that the path from node 24a to node 26a has effectively infinite resistance.

Figure 3:
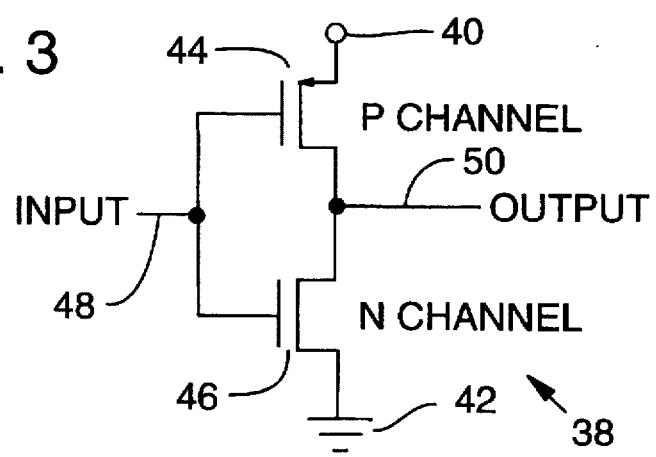
FIG. 3 is an illustrative diagram of an inverter which generates a short-circuit current.

FIG. 3 shows an inverter 38 and illustrates, in conjunction with FIG. 4, how the dynamic short-circuit current occurs. Inverter 38 includes a p-channel MOS transistor 44, an n-channel MOS transistor 46, Vdd 40, ground 42, an input 48 connected to the gates of the transistors 44, 46, and an output 50. If the input is maintained as a logic high, the p-channel transistor 44 remains OFF and the n-channel transistor 46 remains ON so that output 50 is logic low. Similarly, if the input is maintained as a logic low, then the n-channel transistor 46 remains OFF and the p-channel transistor 44 remains ON so that Vdd 40 is connected to output 50, making the output a logic high.

The dynamic short-circuit current occurs when the input 48 switches from a low to high or high to low.

FIG. 4 shows a possible input signal 56 which may be applied to the inverter 38 of FIG. 3. As the signal changes from a logic low to a logic high, the p-channel transistor 44 begins to make the transition from ON to OFF. At the same time, the n-channel transistor 46 begins to make the transition from OFF to ON. Consequently, the output waveform 58 of FIG. 4 makes the inverted transition from a logic high to low in a period of time 64 defined by 60, 62. During the transition period 65 of the input 56, starting from transition point 61 to transition point 63, both transistors 44, 46 are in an intermediate state where they are both partially ON. As a result, current flows from Vdd 40 to ground 42 through transistors 44, 46 during the period 65. This current flow is the dynamic short-circuit current.

FIG. 5 shows the inverter of FIG. 3 modeled at the switch level as a pair of switches 72, 76 and resistors 70, 74 in series, and load capacitance 82. The resistor 70 and switch 72 model transistor 44. Resistor 74 and switch 76 model the transistor 46. When input 48 makes a transition to a logic high, the switch 72 moves from the closed to the open position and the switch 76 moves from the open to the closed position making the output 50 a logic low. For a transient period of time, both switches are in the closed position, allowing current to flow from Vdd 40 to Vss 42. The dynamic short-circuit ratio, which strongly determines the dynamic short-circuit current, is the ratio of the resistance 70 in the first circuit path 78 switching OFF to the resistance 74 in the second circuit path 80 switching ON. Assuming the resistance 70 is Rp and the resistance 74 is Rn, the dynamic short-circuit ratio would be Rp/Rn. Similarly, if the input switched from a logic high to a logic low, the switch 72 would be closing and the switch 76 would be opening. In this case the dynamic short-circuit ratio would be Rn/Rp.

Figure 6:
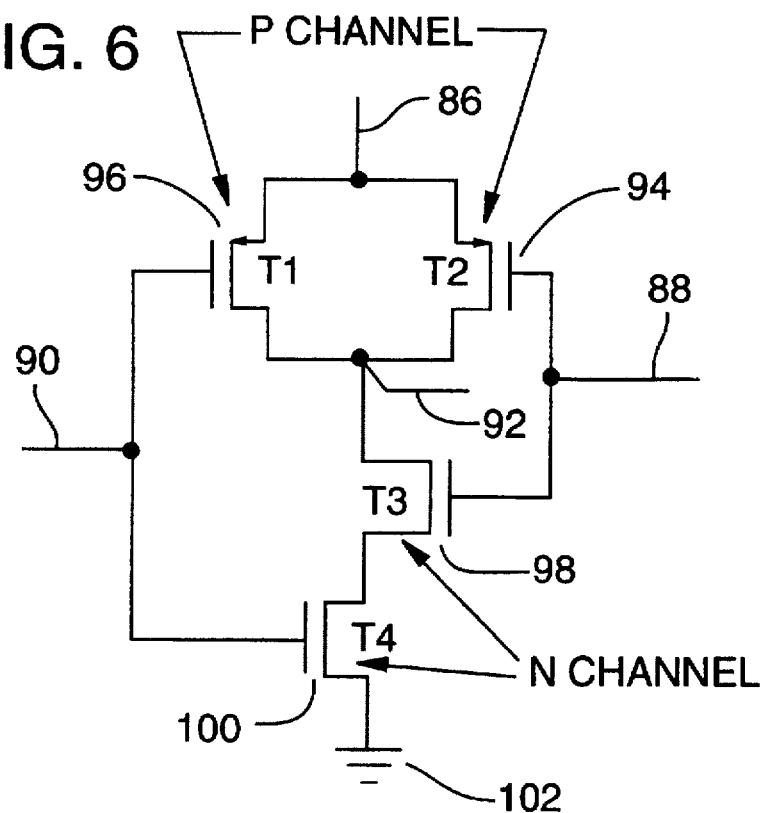
FIG. 6 is an illustrative diagram showing a NAND gate.

FIG. 6 shows a NAND gate having Vdd 86, Vss 102, transistors 94, 96, 98, 100, with associated resistances R1-R4 (not shown) respectively, inputs 88 and 90, and output 92. Transistors 94 and 96 are p-channel transistors and 98 and 100 are n-channel transistors. The output 92 is always a logic high unless the inputs are both a logic low in which case the output is a logic high.

Figure 7:
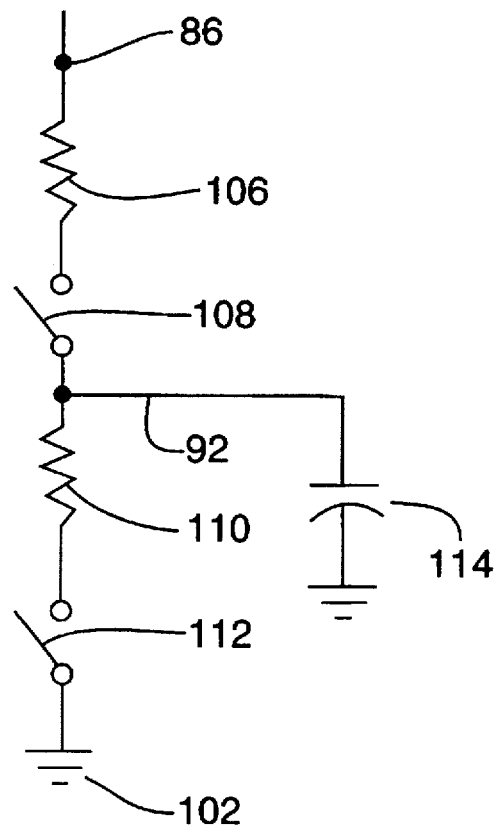
FIG. 7 is a diagram showing switch level modeling of the NAND gate of FIG. 6 as a pair of switches, a pair of resistors, and a load capacitor.

FIG. 7 shows the NAND gate of FIG. 6 modeled as a pair of switches 108, 112 and resistors 106, 110 in series and a load capacitor 114. The resistor 106 and switch 108 model the transistor pair 94 and 96. Similarly, the resistor 110 and switch 112 model transistor pair 98, 100. Assuming that the transistors pair 94 and 96 have associated resistances R1 and R2 which are each equal in value to Rp, then the equivalent resistance of the parallel resistors is 1/2 Rp which is the value of resistor 106. Similarly, the series equivalent of transistor pair 98 and 100 with associated resistance R3 and R4 is R3+R4. Assuming R3 and R4 are equal to Rn, the equivalent resistance of the series resistors is 2Rn, which is the value of resistor 110. The dynamic short-circuit ratio is the ratio of the resistance of the gates transistors turning OFF to the resistance of the transistors turning ON. Assuming the inputs 88 and 90 are such that p-type transistors 94, 96 are turning OFF and the n-type transistors 98, 100 are turning ON, then the dynamic short-circuit ratio is 1/2Rp divided by 2Rn resulting in Rp/4Rn.

Thus, to model a circuit into a switch level abstraction, a computer-implemented process partitions the circuit into channel-connected components. A channel-connected component consists of transistors that are connected via source-drain channels. Each channel-connected component is then partitioned into biconnected components, forming a tree of bicomponents. Each bicomponent is then reduced via series-parallel reduction. Driving-point resistances of each node to Vdd and Vss along with the Elmore delay (see below) can be computed. The process takes advantage of the series-parallel and tree bicomponents by employing a linear time algorithm on these parts. Charge-sharing analysis is explicitly performed. For additional information on Elmore delays the reader can consult W. C. Elmore "The Transient Response of Damped Linear Networks with Particular Regard to Wideband Amplifiers," Journal of Applied Physics, vol. 19, no. 1., at 55–63 (1948).

Once the switch-level process has computed the driving point resistances, the new state of each node is computed and the nodes that are changing state are identified. For each channel-connected component, one of three conditions is identified prior to performing current and charge estimation. These conditions include dynamic short-circuit, static short-circuit, or no short-circuit. The no short-circuit situation involves transitions due to charge-sharing or transitions in which a node goes from a non-driven to a driven state. For each of these three conditions, the current and charge drawn from Vdd and Vss nodes are estimated.

The load capacitance is determined from the capacitance of the nodes that are changing state. A channel-connected component that has multiple nodes changing state has an effective load capacitance that is the sum of the capacitances of all nodes changing state.

Input slew is computed by taking into consideration series and parallel components. For series connected transistors, the effective input slew of a node is the maximum input slew of all the inputs that are switching in the series path. For parallel components, the effective input slew is the minimum input slew of each path in parallel. Inputs that are not switching are considered to have zero input slew.

The delay is modeled as the multiplication of the resistance and load capacitance and then added to the no-load delay. The resistance and no-load delay are a function of the dynamic short-circuit ratio and the input slew. The peak current is a function of the dynamic short-circuit ratio, input slew, and load capacitance.

Accuracy is gained in estimating delay by utilizing the dynamic short-circuit ratio. The resistance of a switch is obtained via table lookup using the dynamic short-circuit ratio and the input slew. Because the switch resistances are a function of the dynamic short-circuit ratio and input slew, the Elmore delay is computed by explicitly including the no-load delay.

Now turning to FIG. 8, a table is created which is a one time per fabrication technology characterization of delay, peak currents and charge per transition while varying input slew, output load capacitance, driver size and dynamic short-circuit ratio. Direct measurement of each parameter to be estimated (delay, peak current, and charge) while varying four of the primary parameters—load, slew, transistor size, and short-circuit ratio—allows high accuracy at the switch level. The three dimensional table of FIG. 8 includes in one dimension 120 the dynamic short-circuit ratio, in a second dimension 118 the input slew, and in a third dimension 116 the load capacitance. Once these values are calculated in the simulation, they can be used to access data 122 in the lookup table of FIG. 8 to determine the charge, peak current, and delay.

Having described and illustrated the principles of our invention with reference to preferred embodiments thereof, it will be apparent that these embodiments can be modified in arrangement and detail without departing from the principles of the invention.

For example, while the invention has been illustrated with reference to elementary circuit topologies for expository convenience, it will be recognized that the general principles thereof are applicable to circuits of arbitrary complexity.

Similarly, while a lookup table is employed containing predetermined values of peak current, delay, and charge, any method of determining one or all of these parameters using a switch level simulator and the dynamic short-circuit ratio may be utilized.

In view of the wide variety of embodiments to which the principles of our invention can be applied, it should be apparent that the detailed embodiments are illustrative only and should not be taken as limiting the scope of our invention. Rather, we claim as our invention all such modifications as may come within the scope and spirit of the following claims and equivalents thereto.

We claim:

1. In a method of electronic circuit simulation wherein a plurality of transistors is modelled as a plurality of resistive switches, an improvement for estimating a transient current between power and ground with at least two of the transistors switching including modeling the transient current as a function of a dynamic short-circuit ratio defined as a ratio of a first resistance in a first circuit path switching OFF to a second resistance in a second circuit path switching ON.

2. A method for determining a parameter of a circuit's operation using an analog simulation device, comprising the steps:
   building a table of values representing how the parameter varies with change in a dynamic short-circuit ratio;
   calculating the dynamic short-circuit ratio in the circuit, the dynamic short-circuit ratio being defined as a ratio of a first resistance in a first circuit path switching OFF to a second resistance in a second circuit path switching ON; and
   searching the table using the dynamic short-circuit ratio to determine the parameter.

3. The method of claim 2 wherein the parameter is current.

4. The method of claim 2 wherein the parameter is delay.

5. The method of claim 2 wherein the parameter is charge.

6. The method of claim 2 wherein the parameter includes current, delay, and charge.

7. The method of claim 2 which further includes entering values representative how the parameter varies with change in input slew, load capacitance, and driver size.

8. The method of claim 2 which further includes calculating the input slew, the load capacitance, and the driver size in the circuit.

9. The method of claim 2 wherein the analog simulation device is a switch level simulator.

10. The method of claim 7 wherein calculating the input slew includes considering a plurality of series and parallel components.

11. The method of claim 7 wherein the input slew for the series components is the maximum input slew of all inputs that are switching in a series path.

12. The method of claim 7 wherein the input slew for the parallel components is the minimum input slew of each path in parallel.

13. The method of claim 2 wherein the first and second circuit paths are formed from a plurality of transistors in parallel or series.

14. A method for determining operational parameters including current, output delay, and charge of a circuit using a computer programmed to perform switch level analog simulation, comprising the steps of:
   building a table of values representative of how the current, delay, and charge vary with change in input slew, dynamic short-circuit ratio, and load capacitance, wherein the delay is modeled as a resistance multiplied by the load capacitance producing a product, the product being added to a no-load delay, wherein the resistance and no-load delay are functions of the dynamic short-circuit ratio and the input slew, and wherein the current and charge are functions of the dynamic short-circuit ratio, input slew, and the load capacitance;
   calculating the input slew, the dynamic short-circuit ratio, and the load capacitance in the circuit, wherein the dynamic short-circuit ratio is defined as a ratio of a first resistance in a first circuit path switching OFF to a second resistance in a second circuit path switching ON, and wherein the input slew for series components is a maximum input slew of all inputs that are switching in a series path and the input slew for parallel components is a minimum input slew of each path in parallel, and wherein the load capacitance is a sum of a plurality of capacitances over a plurality of nodes that are changing voltage levels; and
   indexing the table with input slew, the dynamic short-circuit ratio, and the load capacitance to determine current, delay, and charge.

15. In a simulation method wherein a computer is programmed to simulate operation of an electronic circuit and determine operational parameters therefrom, an improvement including using a dynamic short-circuit ratio in determining a parameter in the simulated electronic circuit, said dynamic short-circuit ratio being defined as a ratio of a first resistance in a first circuit path switching OFF to a second resistance in a second circuit path switching ON.

16. The simulation method of claim 15 wherein the parameter is charge.

17. The simulation method of claim 15 wherein the parameter is current.

18. The simulation method of claim 15 wherein the parameter is delay.

19. The simulation method of claim 15 in which the simulation method is a switch level simulation technique.

20. In a method of electronic circuit simulation wherein a plurality of transistors is modelled as a plurality of resistive switches, an improvement for determining a delay parameter with at least two of the transistors switching, including modeling the delay as a function of a dynamic short-circuit ratio defined as a ratio of a first resistance in a first circuit path switching OFF to a second resistance in a second circuit path switching ON.

21. A method of estimating a transient current between power and ground in a circuit having a pull-up portion and a pull-down portion, the transient current occurring with the pull-up and pull-down portions switching substantially simultaneously, the method comprising the steps of:

determining a first resistance value for the pull-up portion of the circuit;

determining a second resistance value for the pull-down portion of the circuit; and estimating the transient current as the combination of current flowing through one of the pull-up and pull-down portions that is switching OFF and current flowing through the other one of the pull-up and pull-down portions that is switching ON, the combination of current being estimated as a function of the ratio of the first and second resistance values.

22. The method of claim 21 including switching OFF the pull-up portion of the circuit and switching ON the pull-down portion of the circuit and estimating the transient current as a function of the first resistance value divided by the second resistance value.

23. The method of claim 21 including switching ON the pull-up portion of the circuit and switching OFF the pull-down portion of the circuit and estimating the transient current as a function of the second resistance value divided by the first resistance value.

24. The method of claim 21 including estimating a delay in switching the pull-up and pull-down portions of the circuit as a function of the ratio of the first and second resistance values.

* * * * *